United States Patent [19]

Skolnick

[11] Patent Number: 4,853,283
[45] Date of Patent: Aug. 1, 1989

[54] LIGHT REFLECTIVE LAMINATE

[75] Inventor: Barry Skolnick, East Windsor, N.J.

[73] Assignee: Scharr Industries Inc., Bloomfield, Conn.

[21] Appl. No.: 154,972

[22] Filed: Feb. 11, 1988

[51] Int. Cl.⁴ .......................... B32B 15/08; B32B 15/12
[52] U.S. Cl. ..................................... 428/335; 428/457; 428/458; 428/461; 428/464
[58] Field of Search ................ 156/233; 428/457, 458, 428/464, 461, 335

[56] References Cited

U.S. PATENT DOCUMENTS 4,676,857  6/1987  Scharr et al. ..................... 156/233

Primary Examiner—Thomas J. Herbert
Attorney, Agent, or Firm—Fishman, Dionne & Cantor

[57] ABSTRACT

A light reflective material is manufactured using a novel transfer process to provide a final product comprised of a metal substrate, an adhesive on the substrate, a light reflective metal layer (e.g. silver) on the adhesive and a thin (e.g. 0.05 to 0.2 mil) lacquer protective coating on the light reflective metal layer. In a preferred embodiment, an additional lacquer protective coating is used to sandwich the light reflective metal layer between two layers of lacquer coating.

6 Claims, 3 Drawing Sheets

LIGHT REFLECTIVE LAMINATE

BACKGROUND OF THE INVENTION

This invention relates to a light reflective material and a method of manufacture thereof. More particularly, this invention relates to a light reflective material manufactured by a transfer process wherein the final product comprises a laminate having the following layers: a protective coating preferably made from a lacquer material, a reflective material, a layer of adhesive and a layer of metal backing. Preferably, this invention also includes a second layer of a lacquer material between the reflective material and the adhesive layer.

Light reflective materials of the type contemplated by the present invention are well known and find many uses. Such materials typically include a reflective film usually made of silver which is adhesively fixed to a flexible metal backing. This material is then bent or formed (e.g., worked) to a suitable shape and then applied to a desired article of manufacture. Presently, two well known prior art light reflective materials are in use. The prior art materials are respectively shown in FIGS. 1 and 2.

Referring now to FIG. 1, a first type of prior art reflective material is shown generally at 10. Reflective material 10 includes a metal backing or substrate 12 having an adhesive coating 14 thereon. A layer of reflective material 16 (usually silver) is in adhesive contact with adhesive layer 14. The outer surface of reflective layer 16 includes polymeric film 18 which is usually a polyester film (PET). Finally, a removable protective layer 20 of polymeric film is typically applied to the top surface of polyester film layer 18. After assembling layers 12, 14, 16, 18 and 20, the stack-up 10 is laminated. The light reflective material 10 of FIG. 1 is then bent or formed to a desired shape and applied to a desired article. Thereafter, the removable protective layer 20 is removed so that the final product comprises an outer layer of polymeric film 18 along with the inner layers of reflective material 16, adhesive 14 and metal substrate 12.

The prior art reflective laminate of FIG. 1 suffers from certain known deficiencies and drawbacks. For example, the outer polymeric film 18 impairs reflectivity. In addition, film layer 18 may also tend to delaminate. Also, another drawback is that at certain bend sites, film 18 will craze with time which also impairs the reflectivity of the material. Still another deficiency of the FIG. 1 prior material is that along cut edges of the laminate, the film may separate at local sites. These separated local sites may then act as sites for corrosion of the reflective metal 16.

FIG. 2 presents a second known prior reflective material 22 which has certain advantages over the prior art material of FIG. 1; but still continues to suffer from certain drawbacks which will be discussed below. The laminate 22 of FIG. 2 comprises a metal backing or a substrate layer 24 having a layer of suitable adhesive 26 thereon. In contrast to the material of FIG. 1, a layer of polymeric film 28 (usually polyester film) is then adhered to adhesive layer 26. Next, reflective material 30 (typically silver) is provided onto plastic film layer 28. Finally, a thin protective coating 32 is provided on reflective material layer 30. Protective coating 32 is typically comprised of a hard resin such as acrylic. As in the FIG. 1 prior art laminate, a removable protective layer 34 is provided onto protective coating 32. The stack-up is laminated. Removable layer 34 protects the laminate against scratches and marring when the reflective laminate 22 is being formed; and is then removed subsequent to such working.

The prior art material of FIG. 2 has an important advantage over the prior art material of FIG. 1 in that the loss of reflectivity caused by the presence of the polyester film 18 in FIG. 1 is reduced since said polyester film is provided on the underside of reflective layer 30 in FIG. 2. However, prior art FIG. 2 still necessitates the use of a removable protective layer 34 for protecting the reflective material during working. The use of this separate peel off protective film adds to the materials and labor costs during manufacture. In addition, other disadvantages of the prior art material of FIG. 2 are that since the reflective material 30 is added onto the film 28 (rather than onto protective coating 32) the protective coating 32 will tend to flake off the layer of reflective material. In addition, the presence of the polyester film 28 adds significantly to the overall thickness of the material. Finally, like the FIG. 1 embodiments, the presence of film 28 can eventually lead to cracking, crazing and like problems.

It will be appreciated that in both FIGS. 1 and 2, the reflective materials 16 and 30 are deposited on PET films 18 and 28 respectively by well known metal deposition techniques. Thereafter, all of the layers shown are laminated in a conventional manner.

SUMMARY OF THE INVENTION

The above discussed and other problems and deficiencies of the prior art are overcome or alleviated by the reflective material and method of manufacture thereof of the present invention. In accordance with the present invention, a reflective material is manufactured using a transfer process rather than the conventional laminating processes of the prior art. As a result, the final reflective material will include successive layers of a metal backer, an adhesive, a reflective layer and a protective coating which is preferably comprised of a lacquer material. It will be appreciated that this final product will not include a layer of extruded film such as polyester which had been necessitated in the prior art laminates of FIGS. 1 and 2.

In a preferred embodiment, an additional protective coating of lacquer is applied between the adhesive and reflective layer so as to encapsulate or embed the reflective layer in a protective lacquer coating.

The reflective material of the present invention has several important advantages relative to the reflective materials discussed above with regard to prior art FIGS. 1 and 2. For example, the present invention does not necessitate the use of a separate peel-off protective film to protect the outer surface against scratching and marring during shaping. In addition, the present invention presents a very thin final product and the use of a transfer process will tend to result in a smoother final surface for forming the reflective metallization layer. Finally, an adherent protective coating such as lacquer will give better protection than will a laminated film such as used in both prior art materials. The above discussed and other features and advantages of the present invention will be apparent to and understood by those of ordinary skill in the art from the following detailed description and drawings.

BRIEF DESCRIPTION OF THE DRAWINGS

Referring now to the drawings, wherein like elements are numbered alike in the several Figures.

DESCRIPTION OF THE PREFERRED EMBODIMENT

Figure 1:
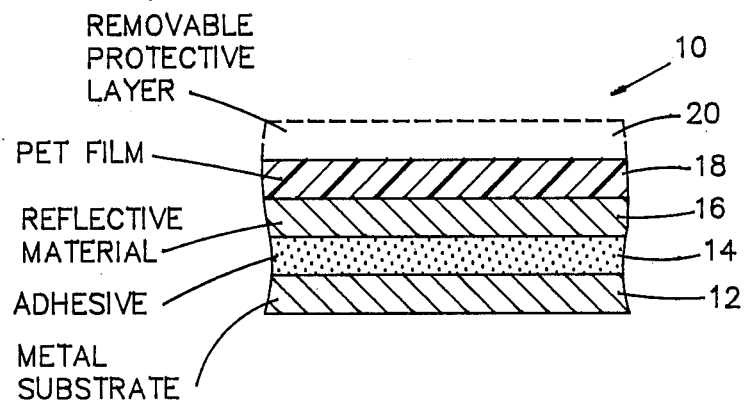
FIG. 1 is a cross sectional elevation view of a first light reflective material in accordance with the prior art.

In accordance with the present invention, a transfer method is used to manufacture a novel reflective material. Referring to FIG. 3, this transfer process comprises the steps of obtaining a layer of suitably strong polymeric film 36 and adding a suitable and known release layer 38 thereto. Next, an adherent coating 40 which preferably comprises a lacquer material is coated onto release layer 38. Protective coating 40 is very thin (about 0.01 to about 2 mils and preferably about 0.05 to about 0.2 mils) and is comprised of a lacquer such a suitable acrylic, urethane, epoxy, vinyl, polyester or cellulosic lacquer. It will be appreciated that the adherent protective coating 40 should be resistant to UV degradation and the transparent to both UV and visible spectrum; and it has been found that lacquer materials are very well suited for this purpose. Next, a reflective material which is usually silver, but may also be any other suitable reflector such as aluminum, copper, chrome, gold, nickel or metal alloys thereof, is deposited onto protective coating 40 preferably by well known sputtering techniques; although any other suitable metallization depositing techniques may be used. Reflective layer preferably has a thickness of about 50 to about 4000 Angstroms. An important feature of the present invention is that the reflective material will form an extremely strong bond with the protective coatings of the type mentioned herein. This is in distinct contrast to the prior art materials of FIGS. 1 and 2 where the reflective material is metallized onto a plastic film. It will be appreciated that a metallization/lacquer bond is much stronger than a metallization/film bond.

After the reflective metal layer 42 has been deposited onto protective coating 40, a substrate 44 having a coating of adhesive 46 thereon is adhered onto reflective layer 42 as shown in FIG. 3. Substrate 44 is preferably metal and has a thickness of about 0.00035 inch to about 0.04 inch. Substrate 44 may also be comprised of a formable plastic, cardboard or other suitable support in addition to metal. It will be appreciated that every time a layer of material is added to reflective layer 42 (which as mentioned is usually silver) there is a risk of scratching the silver surface. As a result, in accordance with the method of the present invention, the silver 42 is the last coating step since adhesive layer 46 may be previously coated to metal substrate 44 and then simply brought into contact with silver layer 42. Consequently, the present invention effectively minimizes any chance of scratching or marring reflective surface 42.

In accordance with well known transfer methods such as disclosed in U.S. Pat. No. 4,676,857, assigned to the assignee hereof, all of the contents of which are incorporated herein by reference, adhesive layer 46 is comprised of any known heat or pressure actuated adhesive. Adhesive layer preferably has a thickness of about 0.1 mil to about 20 mils and may be comprised of any known adhesive suitable for transfer processes including, but not limited to a vinyl, polyethylene, epoxy or acrylic adhesive. The preferred adhesive is a crosslinked polyester adhesive. Thus, as described in Pat. No. 4,676,857, when a patterning tool is brought into contact with the stack-up shown in FIG. 3, adhesive 46 is activated in accordance with the particular pattern on the tool so that layers 42 and 44 are intimately bonded via adhesive layer 46 in a selected pattern.

Figure 2:
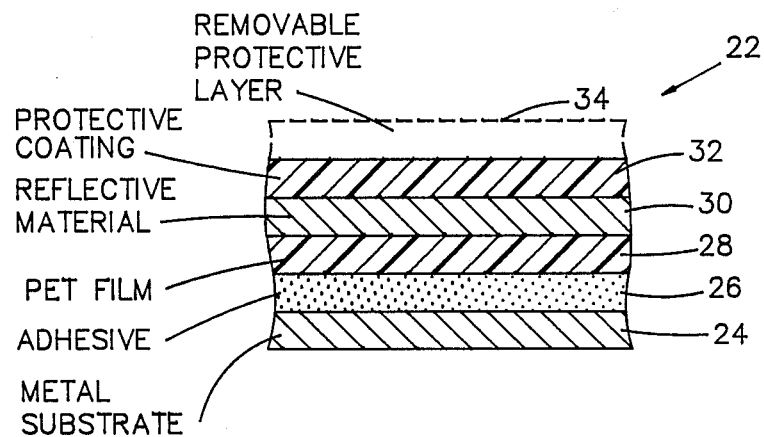
FIG. 2 is a cross sectional elevation view of a second light reflective material in accordance with the prior art.
Figure 3:
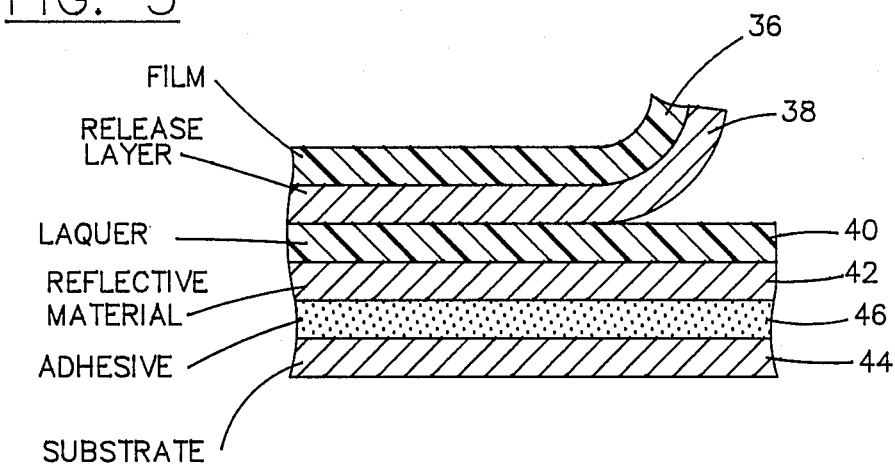
FIG. 3 is a cross sectional elevation view of a light reflective material in accordance with the present invention prior to separation during the transfer process.
Figure 4:
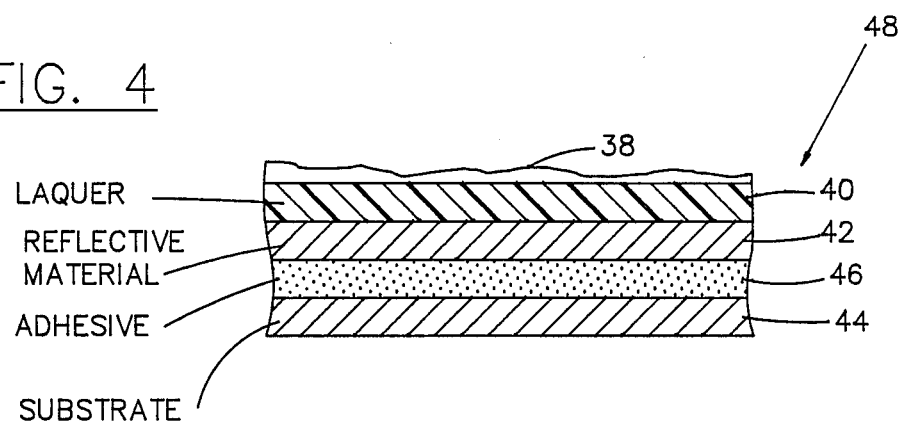
FIG. 4 is a cross sectional elevation view of the final light reflective material of the present invention.

Subsequent to laying out the assembly shown in FIG. 3 and activating adhesive layer 46, the reflective material of the present invention is then shaped to a desired configuration and applied to a desired surface. It will be appreciated that during this working, reflective layer 42 is protected from marring or scratching not only by protective lacquer coating 40 but also by the outer plastic film 36. Next, in accordance with well known transfer techniques, outer layer 36 and release layer 38 (which may comprise any known release agents such as the waxy materials described in U.S. Pat. No. 4,676,857) are peeled back and removed thereby exposing the final product identified generally at 48 in FIG. 4. This final product comprises an outer protective coating 40 of a lacquer material covering layer 42 of reflective material, followed respectively by a layer of adhesive 46 and a metal backer 44. Also, lacquer layer 40 may include some of release layer (wax) 38 thereon. As is apparent from a review of FIG. 4 relative to prior art FIGS. 1 and 2, the final product of the present invention does not include a layer of extruded polymeric film. It will be appreciated that the absence of this layer will lead to a thinner overall material which is preferred.

Figure 5:
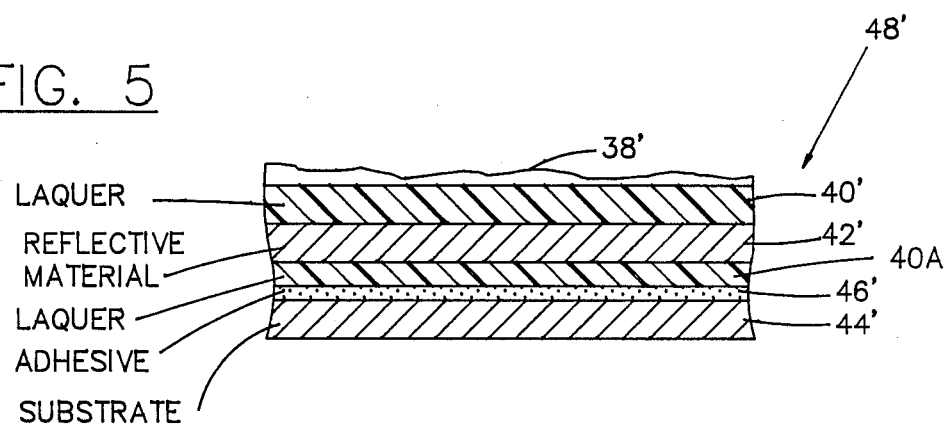
FIG. 5 is a cross sectional elevation view, similar to FIG. 4, of another embodiment of the light reflective material of the present invention.

Turning now to FIG. 5, in a preferred embodiment, the layer of reflective metallization is encapsulated or sandwiched between protective coatings of lacquer. Thus, the FIG. 5 embodiment is similar to the FIG. 4 embodiment (with corresponding elements being identified by a prime), except that a second layer of lacquer 40A has been provided so as to embed reflective material 42' between lacquer layers 40' and 40A. In all other respects light reflective material 48' of FIG. 5 is identical to light reflective material 48 of FIG. 4.

The light reflective material of the present invention has many features and advantages relative to the prior art reflective materials of FIGS. 1 and 2. For example, the use of a transfer process rather than a laminating procedure permits the use of the extruded polymer film 36 to be used as a carrier to build up the stack-up while also serving to protect the material during working. In contrast, the prior art materials necessitated the use of a separate peel-off protective film to protect the outer surfaces against scratching and marring during formation and working.

In addition, the use of a transfer process will provide an end product which is more reflective relative to either of the reflective materials of prior art FIGS. 1 and 2. With regard to prior art FIG. 1, the present invention is more reflective because it does not utilize an outer layer of polyester film. Instead, a much thinner (usually 0.05 to 0.2 mil versus 1-3 mil) lacquer coating is utilized which is transparent to UV and visible light. With regard to prior art FIG. 2, the present invention will be more reflective because a transfer process tends to result in a smoother final surface for metallization layer 42 relative to a laminating process such as is used to produce the material of prior art FIG. 2.

Still another important feature of the present invention is the fact that the reflective material 42 is either sandwiched between a protective coating of lacquer 40 on one side and an adhesive coating 46 on the other (as in the FIG. 4 embodiment); or is sandwiched between a pair of protective lacquer coatings 40' and 40A (as in the FIG. 5 embodiment). This is compared to the prior art materials wherein the reflective material is laminated to at least one layer of extruded polymeric film. It will be appreciated that an adherent coating such as lacquer gives far better protection than does a laminated film such as used in the prior art. This is because, as mentioned above, the laminated polymeric film tends to delaminate, can craze at bend sights and may separate at local sites thereby creating sites for corrosion. In contrast, with the use of a lacquer protective coating, no such delamination, crazing or corrosion can occur.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A light reflective material comprising:
   a substrate layer;
   an adhesive layer on said substrate layer;
   a first lacquer protective coating on said adhesive layer;
   a light reflective metal layer on said first lacquer protective coating; and
   a second lacquer protective coating on said light reflective metal layer.
2. The material of claim 1 wherein:
   said substrate layer is metal.
3. The material of claim 1 wherein:
   said adhesive layer comprises an adhesive selected from the group consisting of polyester, urethane, vinyl, polyethylene, epoxy and acrylics.
4. The material of claim 1 wherein:
   said light reflective metal layer is selected from the group consisting of silver, aluminum, copper, chrome, gold and nickel.
5. The material of claim 1 wherein:
   said lacquer protective coating is selected from the group consisting of acrylics, urethanes, epoxies, vinyls, polyesters and cellulosics.
6. The material of claim 1 wherein:
   said lacquer protective coatings have a thickness of about 0.01 to about 2 mil.

* * * * *